United States Patent
Du Toit et al.

(10) Patent No.: US 7,689,390 B2
(45) Date of Patent: Mar. 30, 2010

(54) METHOD OF MODELING ELECTROSTRICTIVE EFFECTS AND ACOUSTIC RESONANCES IN A TUNABLE CAPACITOR

(75) Inventors: Nicolaas Du Toit, Columbia, MD (US); Louise C. Sengupta, Ellicott City, MD (US)

(73) Assignee: Paratek Microwave, Inc., Nashua, NH (US)

( * ) Notice: Subject to any disclaimer, the term of this patent is extended or adjusted under 35 U.S.C. 154(b) by 0 days.

(21) Appl. No.: 12/012,310

(22) Filed: Feb. 2, 2008

(65) Prior Publication Data

US 2008/0204967 A1    Aug. 28, 2008

Related U.S. Application Data

(62) Division of application No. 11/178,041, filed on Jul. 9, 2005, now abandoned.

(51) Int. Cl.
G06F 17/50    (2006.01)
G06F 7/60    (2006.01)

(52) U.S. Cl. .......................................... 703/2
(58) Field of Classification Search ................ 703/2
See application file for complete search history.

(56) References Cited

U.S. PATENT DOCUMENTS

| | | | |
|---|---|---|---|
| 5,312,790 A | 5/1994 | Sengupta et al. | 522/127 |
| 5,427,988 A | 6/1995 | Sengupta et al. | 501/137 |
| 5,438,554 A * | 8/1995 | Seyed-Bolorforosh et al. | 367/140 |
| 5,486,491 A | 1/1996 | Sengupta et al. | 501/137 |
| 5,593,495 A | 1/1997 | Masuda et al. | 117/4 |
| 5,635,433 A | 6/1997 | Sengupta | 501/137 |
| 5,635,434 A | 6/1997 | Sengupta | 501/138 |
| 5,640,042 A | 6/1997 | Koscica et al. | 257/595 |
| 5,693,429 A | 12/1997 | Sengupat et al. | 428/699 |
| 5,694,134 A | 12/1997 | Barnes | 343/700 |
| 5,766,697 A | 6/1998 | Sengupta et al. | 427/585 |
| 5,830,591 A | 11/1998 | Sengupta et al. | 428/701 |
| 5,846,893 A | 12/1998 | Sengupta et al. | 501/137 |
| 5,886,867 A | 3/1999 | Chivukula et al. | 361/311 |
| 5,990,766 A | 11/1999 | Zhang et al. | 333/205 |
| 6,074,971 A | 6/2000 | Chiu et al. | 501/139 |
| 6,377,142 B1 | 4/2002 | Chiu et al. | 333/238 |

(Continued)

OTHER PUBLICATIONS

Tappe et al, "Electrostrictive Resonances in (Ba0.7Sr0.3)TiO3 Thin Films at Microwave Frequencies", Applied Physics Letters, vol. 85, No. 4, Jul. 26, 2004.*

(Continued)

*Primary Examiner*—Paul L Rodriguez
*Assistant Examiner*—Dwin M Craig
(74) *Attorney, Agent, or Firm*—Ed Guntin; Akerman Senterfitt

(57) ABSTRACT

An embodiment of the present invention provides a method of modeling electrostrictive effects and acoustic resonances in a tunable capacitor, comprising adjusting empirically the characteristic impedances and complex propagation constants to account for actual process variations in manufacturing of the tunable capacitor; adjusting empirically the characteristic impedances and complex propagation constants to account for end-effects in the directions transversal to the wave direction; and modeling the electrostrictive effect by dividing a BST layer of the tunable capacitor into thin layers or slices with each slice's thickness representing a small fraction of an acoustic wavelength and injecting at each junction between slices, an acoustic current proportional to the electrical current through the voltage tunable capacitor.

2 Claims, 4 Drawing Sheets

U.S. PATENT DOCUMENTS

| | | | |
|---|---|---|---|
| 6,377,217 B1 | 4/2002 | Zhu et al. | 343/700 |
| 6,377,440 B1 | 4/2002 | Zhu et al. | 361/311 |
| 6,404,614 B1 | 6/2002 | Zhu et al. | 361/277 |
| 6,492,883 B2 | 12/2002 | Liang et al. | 333/132 |
| 6,514,895 B1 | 2/2003 | Chiu et al. | 501/137 |
| 6,525,630 B1 | 2/2003 | Zhu et al. | 333/205 |
| 6,531,936 B1 | 3/2003 | Chiu et al. | 333/164 |
| 6,535,076 B2 | 3/2003 | Partridge et al. | 333/17.1 |
| 6,538,603 B1 | 3/2003 | Chen et al. | 342/372 |
| 6,556,102 B1 | 4/2003 | Sengupta et al. | 333/161 |
| 6,590,468 B2 | 7/2003 | du Toit et al. | 333/17.3 |
| 6,597,265 B2 | 7/2003 | Liang et al. | 333/204 |

OTHER PUBLICATIONS

Kozyrev et al, "Procedures of Measurements of Ferroelectric Films Parameters in Frequency Range (20-60) GHz", Integrated Ferroelectrics, 55, pp. 895-903, 2003.*

* cited by examiner

METHOD OF MODELING ELECTROSTRICTIVE EFFECTS AND ACOUSTIC RESONANCES IN A TUNABLE CAPACITOR

CROSS-REFERENCE TO RELATED APPLICATION

This application is a divisional of U.S. patent application Ser. No. 11/178,041 filed Jul. 9, 2005, now abandoned, entitled, AN APPARATUS AND METHOD CAPABLE OF A HIGH FUNDAMENTAL ACOUSTIC RESONANCE FREQUENCY AND A WIDE RESONANCE-FREE FREQUENCY RANGE", to Du Toit et al. assigned to Paratek Microwave, Inc.

BACKGROUND OF THE INVENTION

Varactors are voltage tunable capacitors in which the capacitance is dependent on a voltage applied thereto. Although not limited in this respect, this property has applications in electrically tuning radio frequency (RF) circuits, such as filters, phase shifters, and so on. The most commonly used varactor is semiconductor diode varactor, which has the advantages of high tunability and low tuning voltage, but suffers low Q, low power handling capability, and limited capacitance range. A new type of varactor is a ferroelectric varactor in which the capacitance is tuned by varying the dielectric constant of a ferroelectric material by changing the bias voltage. Ferroelectric varactors have high Q, high power handling capacity, and high capacitance range.

One ferroelectric varactor is disclosed in U.S. Pat. No. 5,640,042 entitled "Thin Film Ferroelectric Varactor" by Thomas E. Koscica et al. That patent discloses a planar ferroelectric varactor, which includes a carrier substrate layer, a high temperature superconducting metallic layer deposited on the substrate, a lattice matching, a thin film ferroelectric layer deposited on the metallic layer, and a plurality of metallic conductors disposed on the ferroelectric layer and in contact with radio frequency (RF) transmission lines in tuning devices. Another tunable capacitor using a ferroelectric element in combination with a superconducting element is disclosed in U.S. Pat. No. 5,721,194. Tunable varactors that utilize a ferroelectric layer, and various devices that include such varactors are also disclosed in U.S. Pat. No. 6,531,936, entitled "Voltage Tunable Varactors And Tunable Devices Including Such Varactors," filed Oct. 15, 1999, and assigned to the same assignee as the present invention.

A major concern in tunable capacitors including voltage tunable dielectric capacitors is the elimination of losses due to the electrostrictive effect and acoustic resonances. These resonances typically manifest as a series of bumps and ripples on the Q vs. Frequency characteristic of a tunable capacitor causing the Q-factor to dip as low as 10 to 20.

A model of dielectric losses due to the electrostrictive effect and acoustic resonances has been proposed with Electrostrictive resonances in Ba0.7Sr0.3.TiO3 thin films at microwave frequencies which uses very thin BST layers, which would ensure a sufficiently high fundamental frequency of the acoustic resonance—i.e. beyond the frequency range of the application.

However, the aforementioned thin BST layers are impractical due to manufacturability and linearity considerations. Hence, what is needed is an apparatus and method capable of a high fundamental acoustic resonance frequency and a wide resonance-free frequency range using films that are readily manufacturable.

SUMMARY OF THE INVENTION

An embodiment of the present invention provides an apparatus capable of a high fundamental acoustic resonance frequency, comprising a substrate, a bottom electrode layer adjacent the substrate, a voltage tunable dielectric layer adjacent the bottom electrode layer, the voltage tunable dielectric layer including an active region, a top electrode adjacent the voltage tunable dielectric layer, a final interconnect layer connected to the top electrode via an interlayer, and wherein the top and bottom electrodes are at a predetermined thickness such that a desired high fundamental acoustic resonance is obtained. The active region of the voltage tunable dielectric layer may be approximately the length of the top electrode and the interlayer and the final interconnect layer may cover only a small fraction of the active region of the voltage tunable dielectric layer, thereby reducing the amplitude of resonances due to the interlayer or final interconnect layer.

In an embodiment of the present invention, the substrate may be chosen to have a high acoustic loss factor thereby reducing the amplitude of resonances due to the substrate layer and the voltage tunable dielectric layer may be an approximately 300 nm thick BST layer matched with an approximately 150 nm gold top electrode and approximately 200 nm platinum bottom electrode and the interlayer and final interconnect layers may cover only a small percentage of the active region.

Another embodiment of the present invention further provides an apparatus capable of a wide resonance-free frequency range comprising, a substrate, a bottom electrode layer adjacent the substrate, a voltage tunable dielectric layer adjacent the bottom electrode layer, the voltage tunable dielectric layer including an active region, a top electrode adjacent the voltage tunable dielectric layer, a final interconnect layer connected to the top electrode via an interlayer, and wherein the top electrode is made sufficiently thick such that the fundamental acoustic resonance lies below a desired frequency range and the bottom electrode thickness is selected to suppress the second overtone of the acoustic resonance thereby creating a wide resonance-free frequency range lying between the fundamental and third overtone of the acoustic resonance. In this embodiment the active region of the voltage tunable dielectric layer may be approximately the length of the top electrode and the interlayer and the final interconnect layer may cover only a small fraction of the active region, thereby reducing the amplitude of resonances due to the interlayer or final interconnect layer. The voltage tunable dielectric layer may be an approximately 0.71 µm thick BST layer and may be matched with an approximately 0.49 µm gold top electrode and an approximately 0.56 µm platinum bottom electrode.

Yet another embodiment of the present invention provides a method of modeling electrostrictive effects and acoustic resonances in a tunable capacitor, comprising adjusting empirically the characteristic impedances and complex propagation constants to account for actual process variations in manufacturing of the tunable capacitor, adjusting empirically the characteristic impedances and complex propagation constants to account for end-effects in the directions transversal to the wave direction, modeling the electrostrictive effect by dividing a BST layer of the tunable capacitor into thin layers or slices with each slice's thickness representing a small fraction of an acoustic wavelength and injecting at each junction between slices, an acoustic "current" proportional to the electrical current through the voltage tunable capacitor. The real part of the vector sum of acoustic "voltages" at all slice junctions may be divided by the electrical current vector, and may be taken to be representative of that part of the voltage tunable capacitor's effective series resistance contributed by the electrostrictive effect and acoustic resonances. Further, the electrostrictive effect may be the transducer mechanism that links the electrical and acoustic domains.

Yet another embodiment of the present invention provides a method of producing a high fundamental acoustic resonance frequency, comprising, placing a bottom electrode layer adjacent a substrate with a voltage tunable dielectric layer adjacent the bottom electrode layer, the voltage tunable dielectric layer including an active region, placing a top electrode adjacent the voltage tunable dielectric layer with a final interconnect layer connected to the top electrode via an interlayer; and using the top and bottom electrodes at a predetermined thickness such that a desired high fundamental acoustic resonance is obtained.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DESCRIPTION OF THE PREFERRED EMBODIMENT

Figure 1:
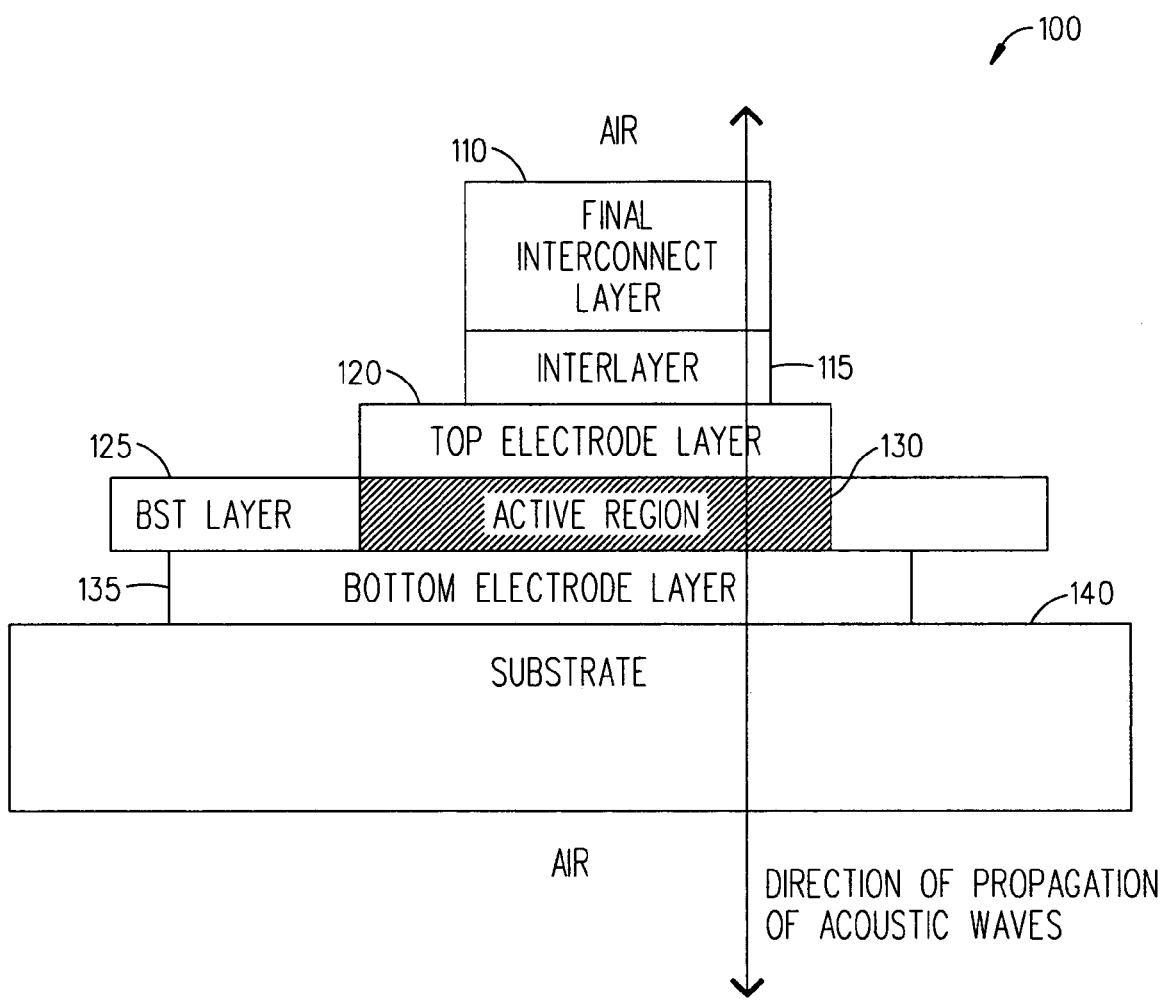
FIG. 1 illustrates a cross-sectional view of a tunable capacitor structure of one embodiment of the present invention.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

An embodiment of the present invention provides a method of modeling the electrostrictive effect and acoustic resonances that facilitates the design of arbitrary circuits in the acoustic domain of the PTC structure. Provided herein is a first exemplary acoustic circuit design involving BST layers of practical thickness with metal layers arranged such that a sufficiently high fundamental frequency of the acoustic resonance can be achieved. It is understood that this circuit is merely illustrative and the present invention is not limited to any particular circuits nor should the present invention be considered to be limited to only BST.

As another illustrative example, and not by way of limitation, an embodiment of the present invention further provides a second specific acoustic circuit design involving BST layers of practical thickness with metal layers arranged such that a wide resonance-free frequency range can be selected in design.

A method of modeling electrostrictive effect and acoustic resonances that facilitates the design of arbitrary circuits in the acoustic domain of the PTC structure may include the following:

Step 1. It is assumed that an electrostrictive effect causes a small amount of RF energy to be converted into acoustic energy, which exists within the entire PTC structure as bulk acoustic waves traveling in the two directions perpendicular to the BST layer. These waves are modeled as equivalent electrical waves existing in transmission lines with characteristic impedances and complex propagation constants typically derived.

Step 2. The characteristic impedances and complex propagation constants are adjusted empirically to account for actual process variations in manufacturing of the tunable capacitors;

Step 3. The characteristic impedances and complex propagation constants are adjusted empirically to account for end-effects in the directions transversal to the wave direction, viz. layers extending further than the active area (such as the substrate) and layers not completely covering the entire active area (such as the final interconnect layer).

Step 4. The electrostrictive effect, i.e. the transducer mechanism that links the electrical and acoustic domains, is modeled by dividing the BST layer into thin layers or slices—each slice's thickness representing a small fraction of an acoustic wavelength—and injecting at each junction between slices, an acoustic "current" proportional to the electrical current through the tunable capacitor. The real part of the vector sum of acoustic "voltages" at all slice junctions, divided by the electrical current vector, is taken to be representative of (proportional to) that part of the tunable capacitor effective series resistance (ESR) contributed by the electrostrictive effect and acoustic resonances. This method of modeling recognizes the fact that the BST layer has insignificant thickness in terms of electrical wavelengths, while having appreciable thickness in terms of acoustic wavelengths.

Table 1 illustrates the range of acoustic parameters that were found to provide repeatable modeling of the ESR for various PTC designs, although it is understood that the present invention is not limited in this respect nor limited to the below values, parameters or materials.

TABLE 1

Ranges of Acoustic Parameters used in Modeling of ESR

| Material | Parameter | Units | Min value | Max value | Comment |
|---|---|---|---|---|---|
| MgO | Velocity of sound | m/s | 6,000 | 10,000 | Substrate |
|  | Characteristic impedance | Ohm | 13,000 | 35,000 | Substrate |
|  | Attenuation per wavelength | dB | 0 | 5 | Substrate |
| $Al_2O_3$ | Velocity of sound | m/s | 8,000 | 12,000 | Substrate |
|  | Characteristic impedance | Ohm | 17,000 | 45,000 | Substrate |
|  | Attenuation per wavelength | dB | 0 | 5 | Substrate |
| Pt | Velocity of sound | m/s | 3,000 | 4,000 | Electrode |
|  | Characteristic impedance | Ohm | 65,000 | 75,000 | Electrode |
|  | Attenuation per wavelength | dB | 0 | 2 | Electrode |
| BST | Velocity of sound | m/s | 4,000 | 10,000 | Active layer |
|  | Characteristic impedance | Ohm | 40,000 | 60,000 | Active layer |
|  | Attenuation per wavelength | dB | 0 | 2 | Active layer |

TABLE 1-continued

Ranges of Acoustic Parameters used in Modeling of ESR

| Material | Parameter | Units | Min value | Max value | Comment |
|---|---|---|---|---|---|
| Ti | Velocity of sound | m/s | 4,000 | 5,000 | Interlayer |
| | Characteristic impedance | Ohm | 4,000 | 70,000 | Interlayer |
| | Attenuation per wavelength | dB | 0 | 2 | Interlayer |
| Au | Velocity of sound | m/s | 2,500 | 3,000 | Interconnect |
| | Characteristic impedance | Ohm | 14,000 | 70,000 | Interconnect |
| | Attenuation per wavelength | dB | 0 | 2 | Interconnect |

An embodiment of the present invention provides designing for a high fundamental acoustic resonance frequency which may include the BST being chosen to be of a practical thickness in terms of considerations other than acoustic resonance. These considerations could be and are not limited to linearity and manufacturability.

Turning now to the figures, FIG. 1, shown generally as 100, is a cross-sectional view of a tunable capacitor structure of one embodiment of the present invention. The top 120 and bottom 135 electrodes may be made sufficiently thin and residing on substrate 140 such that a sufficiently high fundamental acoustic resonance is obtained. As an optional further refinement when applicable, the tunable capacitor may be designed such that the interlayer 115 and final interconnect layer 110 cover only a small fraction of the active region 130 of BST layer 125, thereby reducing the amplitude of resonances due to the interlayer 115 or final interconnect layer 110. The interlayer 115 and final interconnect layer 110 thickness and material properties may therefore be unimportant. As an optional further refinement when applicable, the substrate may be chosen to have a high acoustic loss factor, $Al_2O_3$ being a better choice than MgO, thereby reducing the amplitude of resonances due to the substrate layer 140. The substrate layer 140 thickness is unimportant. In a preferred embodiment of this design, a 300 nm thick BST layer was matched with a 150 nm gold top electrode and 200 nm platinum bottom electrode. As further refinements, an $Al_2O_3$ substrate was used and the interlayer and final interconnect layers covered only a small percentage of the active region.

Figure 2:
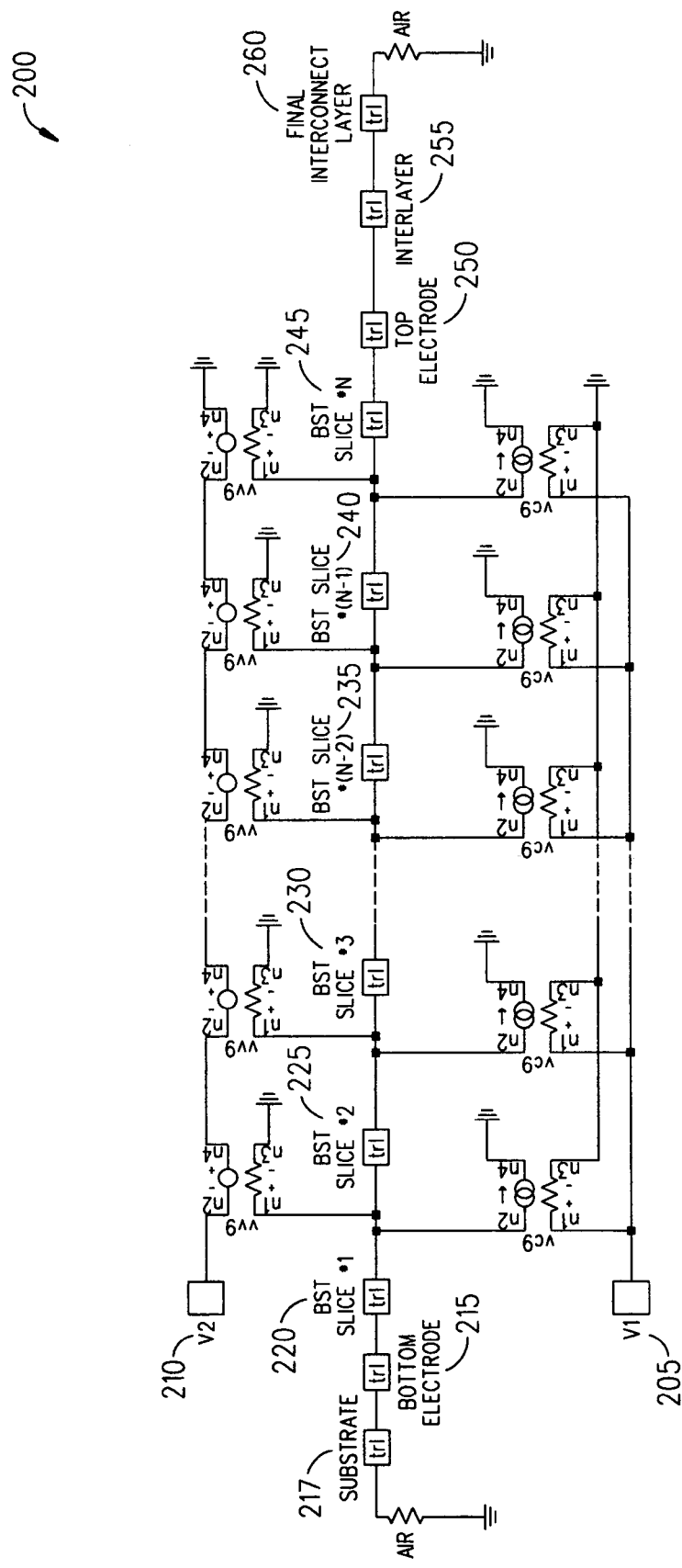
FIG. 2 illustrates a schematic diagram of one embodiment of the present invention.

Turning now to FIG. 2, generally at 200, is a schematic diagram of one embodiment of the present invention. As can be seen from FIG. 2 ESR∝Re($V_2/V_1$), with, $V_2$/shown as 210 and $V_1$ shown at 205. Illustrative BST slices of circuit 200 are shown at 220, 225, 230, 235, 240 and 245 with subtrate at 217 and bottom electrode depicted at 215 and top electrode at 250 adjacent interlayer 255 which in turn is adjacent final interconnect layer 260. Again, it is understood that any circuits provided herein are merely illustrative and the present invention is not intended to be limited to any particular circuits configurations.

Figure 3:
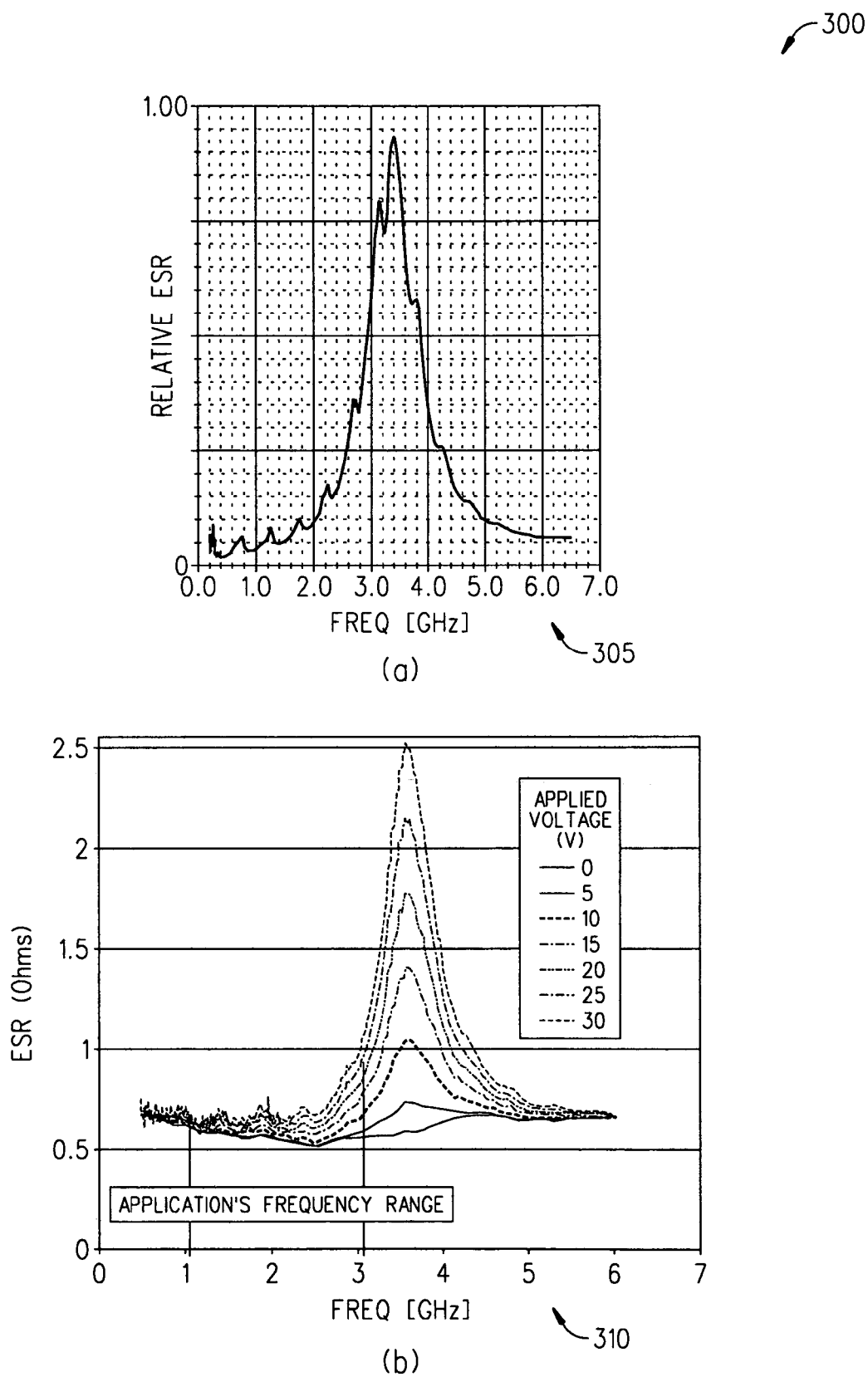
FIGS. 3a and 3b illustrate a simulated relative ESR (a), and measured ESR (b), for a 300 nm thick BST layer matched with a 150 nm gold top electrode and 200 nm platinum bottom electrode of one embodiment of the present invention.

FIGS. 3(a) 305 and (b) 310 shows graphs of the ESR obtained respectively through simulation and measurement in Frequency in GHz vs. relative ESR (a) and Frequency in GHz vs ESR in ohms (b).

An embodiment of the present invention provides designing for a wide resonance-free frequency range where the BST may be chosen to be of a practical thickness in terms of considerations other than acoustic resonance. These considerations could be and are not limited to linearity and manufacturability. The top electrode is made sufficiently thick such that the fundamental acoustic resonance lies below the frequency range of interest for the application. The bottom electrode may be carefully selected to suppress the second overtone of the acoustic resonance thereby creating a wide resonance-free frequency range lying between the fundamental and third overtone of the acoustic resonance. As an optional further refinement when applicable, the tunable capacitor may be designed such that the interlayer and final interconnect layer cover only a small fraction of the active region (as shown in FIG. 1), thereby reducing the amplitude of resonances due to the interlayer or final interconnect layer. The interlayer and final interconnect layer thickness and material properties are therefore unimportant. As an optional further refinement when applicable, the substrate may be chosen to have a high acoustic loss factor, $Al_2O_3$ being a better choice than MgO, thereby reducing the amplitude of resonances due to the substrate layer. The substrate layer thickness is unimportant. In an embodiment of this design, a 0.71 μm thick BST layer was matched with a 0.49 μm gold top electrode and 0.56 μm platinum bottom electrode. As further refinements, an MgO substrate may be used and the interlayer and final interconnect layers may cover only a small percentage of the active region.

Figure 4:
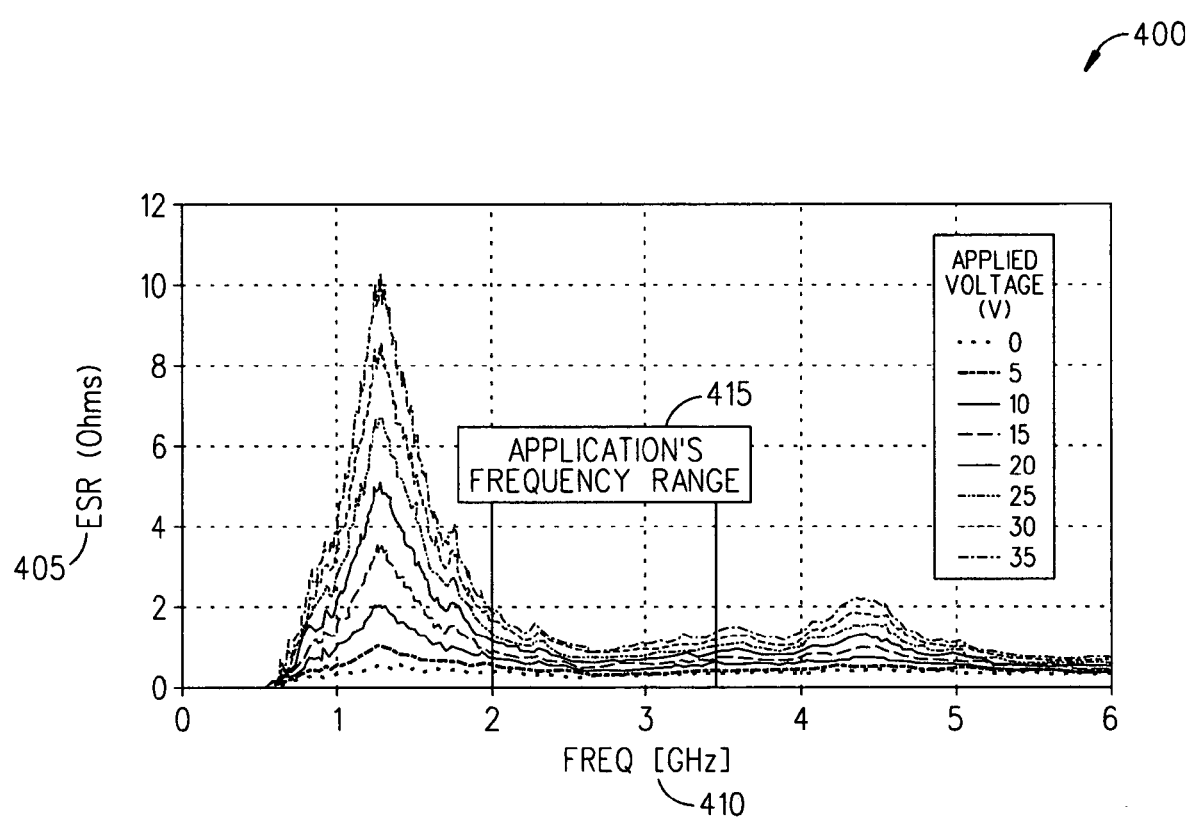
FIG. 4 depicts the measured ESR for a 710 nm thick BST layer matched with a 490 nm gold top electrode and 560 nm platinum bottom electrode.

Turning now to FIG. 4, generally shown as 400, are measurements depicted as ESR 405 vs. Frequency 410, of the ESR obtained with the measured ESR for a 710 nm thick BST layer matched with a 490 nm gold top electrode and 560 nm platinum bottom electrode. It is understood that these specific values are for thoroughness of description and are not meant in anyway to limit the present invention to any particular specific measurements.

Throughout the aforementioned description, BST has been used as a tunable dielectric material that may be used in a tunable dielectric capacitor of the present invention. However, the assignee of the present invention, Paratek Microwave, Inc. has developed and continues to develop tunable dielectric materials that may be utilized in embodiments of the present invention and thus the present invention is not limited to using BST material. This family of tunable dielectric materials may be referred to as Parascan®.

The term Parascan® as used herein is a trademarked term indicating a tunable dielectric material developed by the assignee of the present invention. Parascan® tunable dielectric materials have been described in several patents. Barium strontium titanate (BaTiO3-SrTiO3), also referred to as BSTO, is used for its high dielectric constant (200-6,000) and large change in dielectric constant with applied voltage (25-75 percent with a field of 2 Volts/micron). Tunable dielectric materials including barium strontium titanate are disclosed in U.S. Pat. No. 5,312,790 to Sengupta, et al. entitled "Ceramic Ferroelectric Material"; U.S. Pat. No. 5,427,988 by Sengupta, et al. entitled "Ceramic Ferroelectric Composite Material-BSTO-MgO"; U.S. Pat. No. 5,486,491 to Sengupta, et al. entitled "Ceramic Ferroelectric Composite Material-BSTO-ZrO2"; U.S. Pat. No. 5,635,434 by Sengupta, et al. entitled "Ceramic Ferroelectric Composite Material-BSTO-Magnesium Based Compound"; U.S. Pat. No. 5,830,591 by Sengupta, et al. entitled "Multilayered Ferroelectric Composite Waveguides"; U.S. Pat. No. 5,846,893 by Sengupta, et al. entitled "Thin Film Ferroelectric Composites and Method of Making"; U.S. Pat. No. 5,766,697 by Sengupta, et al. entitled "Method of Making Thin Film Composites"; U.S. Pat. No. 5,693,429 by Sengupta, et al. entitled "Electronically Graded Multilayer Ferroelectric Composites"; U.S. Pat. No. 5,635, 433 by Sengupta entitled "Ceramic Ferroelectric Composite Material BSTO-ZnO"; U.S. Pat. No. 6,074,971 by Chiu et al. entitled "Ceramic Ferroelectric Composite Materials with Enhanced Electronic Properties BSTO Mg Based Compound-Rare Earth Oxide". These patents are incorporated herein by reference. The materials shown in these patents, especially BSTO-MgO composites, show low dielectric loss and high tunability. Tunability is defined as the fractional change in the dielectric constant with applied voltage.

Barium strontium titanate of the formula $Ba_xSr_{1-x}TiO_3$ is a preferred electronically tunable dielectric material due to its favorable tuning characteristics, low Curie temperatures and low microwave loss properties. In the formula $Ba_xSr_{1-x}TiO_3$, x can be any value from 0 to 1, preferably from about 0.15 to about 0.6. More preferably, x is from 0.3 to 0.6.

Other electronically tunable dielectric materials may be used partially or entirely in place of barium strontium titanate. An example is $Ba_xCa_{1-x}TiO_3$, where x is in a range from about 0.2 to about 0.8, preferably from about 0.4 to about 0.6. Additional electronically tunable ferroelectrics include $Pb_xZr_{1-x}TiO_3$ (PZT) where x ranges from about 0.0 to about 1.0, $Pb_xZr_{1-x}SrTiO_3$ where x ranges from about 0.05 to about 0.4, $KTa_xNb_{1-x}O_3$ where x ranges from about 0.0 to about 1.0, lead lanthanum zirconium titanate (PLZT), $PbTiO_3$, $BaCaZrTiO_3$, $NaNO_3$, $KNbO_3$, $LiNbO_3$, $LiTaO_3$, $PbNb_2O_6$, $PbTa_2O_6$, $KSr(NbO_3)$ and $NaBa_2(NbO_3)_5 KH_2PO_4$, and mixtures and compositions thereof. Also, these materials can be combined with low loss dielectric materials, such as magnesium oxide (MgO), aluminum oxide ($Al_2O_3$), and zirconium oxide ($ZrO_2$), and/or with additional doping elements, such as manganese (MN), iron (Fe), and tungsten (W), or with other alkali earth metal oxides (i.e. calcium oxide, etc.), transition metal oxides, silicates, niobates, tantalates, aluminates, zirconnates, and titanates to further reduce the dielectric loss.

In addition, the following U.S. patent applications, assigned to the assignee of this application, disclose additional examples of tunable dielectric materials: U.S. application Ser. No. 09/594,837 filed Jun. 15, 2000, entitled "Electronically Tunable Ceramic Materials Including Tunable Dielectric and Metal Silicate Phases"; U.S. application Ser. No. 09/768,690 filed Jan. 24, 2001, entitled "Electronically Tunable, Low-Loss Ceramic Materials Including a Tunable Dielectric Phase and Multiple Metal Oxide Phase"; U.S. application Ser. No. 09/882,605 filed Jun. 15, 2001, entitled "Electronically Tunable Dielectric Composite Thick Films And Methods Of Making Same"; U.S. application Ser. No. 09/834,327 filed Apr. 13, 2001, entitled "Strain-Relieved Tunable Dielectric Thin Films"; and U.S. Provisional Application Ser. No. 60/295,046 filed Jun. 1, 2001 entitled "Tunable Dielectric Compositions Including Low Loss Glass Frits". These patent applications are incorporated herein by reference.

The tunable dielectric materials can also be combined with one or more non-tunable dielectric materials. The non-tunable phase(s) may include MgO, $MgAl_2O_4$, $MgTiO_3$, $Mg_2SiO_4$, $CaSiO_3$, $MgSrZrTiO_6$, $CaTiO_3$, $Al_2O_3$, $SiO_2$ and/or other metal silicates such as $BaSiO_3$ and $SrSiO_3$. The non-tunable dielectric phases may be any combination of the above, e.g., MgO combined with $MgTiO_3$, MgO combined with $MgSrZrTiO_6$, MgO combined with $Mg_2SiO_4$, MgO combined with $Mg_2SiO_4$, $Mg_2SiO_4$ combined with $CaTiO_3$ and the like.

Additional minor additives in amounts of from about 0.1 to about 5 weight percent can be added to the composites to additionally improve the electronic properties of the films. These minor additives include oxides such as zirconnates, tannates, rare earths, niobates and tantalates. For example, the minor additives may include $CaZrO_3$, $BaZrO_3$, $SrZrO_3$, $BaSnO_3$, $CaSnO_3$, $MgSnO_3$, $Bi_2O_3/2SnO_2$, $Nd_2O_3$, $Pr_7O_{11}$, $Yb_2O_3$, $Ho_2O_3$, $La_2O_3$, $MgNb_2O_6$, $SrNb_2O_6$, $BaNb_2O_6$, $MgTa_2O_6$, $BaTa_2O_6$ and $Ta_2O_3$.

Thick films of tunable dielectric composites may comprise $Ba_{1-x}Sr_xTiO_3$, where x is from 0.3 to 0.7 in combination with at least one non-tunable dielectric phase selected from MgO, $MgTiO_3$, $MgZrO_3$, $MgSrZrTiO_6$, $Mg_2SiO_4$, $CaSiO_3$, $MgAl_2O_4$, $CaTiO_3$, $Al_2O_3$, $SiO_2$, $BaSiO_3$ and $SrSiO_3$. These compositions can be BSTO and one of these components, or two or more of these components in quantities from 0.25 weight percent to 80 weight percent with BSTO weight ratios of 99.75 weight percent to 20 weight percent.

The electronically tunable materials may also include at least one metal silicate phase. The metal silicates may include metals from Group 2A of the Periodic Table, i.e., Be, Mg, Ca, Sr, Ba and Ra, preferably Mg, Ca, Sr and Ba Preferred metal silicates include $Mg_2SiO_4$, $CaSiO_3$, $BaSiO_3$ and $SrSiO_3$. In addition to Group 2A metals, the present metal silicates may include metals from Group 1A, i.e., Li, Na, K, Rb, Cs and Fr, preferably Li, Na and K. For example, such metal silicates may include sodium silicates such as $Na_2SiO_3$ and $NaSiO_3\text{-}5H_2O$, and lithium-containing silicates such as $LiAlSiO_4$, $Li_2SiO_3$ and $Li_4SiO_4$. Metals from Groups 3A, 4A and some transition metals of the Periodic Table may also be suitable constituents of the metal silicate phase. Additional metal silicates may include $Al_2Si_2O_7$, $ZrSiO_4$, $KalSi_3O_8$, $NaAlSi_3O_8$, $CaAl_2Si_2O_8$, $CaMgSi_2O_6$, $BaTiSi_3O_9$ and $Zn_2SiO_4$. The above tunable materials can be tuned at room temperature by controlling an electric field that is applied across the materials.

In addition to the electronically tunable dielectric phase, the electronically tunable materials can include at least two additional metal oxide phases. The additional metal oxides may include metals from Group 2A of the Periodic Table, i.e., Mg, Ca, Sr, Ba, Be and Ra, preferably Mg, Ca, Sr and Ba. The additional metal oxides may also include metals from Group 1A, i.e., Li, Na, K, Rb, Cs and Fr, preferably Li, Na and K. Metals from other Groups of the Periodic Table may also be suitable constituents of the metal oxide phases. For example, refractory metals such as Ti, V, Cr, Mn, Zr, Nb, Mo, Hf, Ta and W may be used. Furthermore, metals such as Al, Si, Sn, Pb and Bi may be used. In addition, the metal oxide phases may comprise rare earth metals such as Sc, Y, La, Ce, Pr, Nd and the like.

The additional metal oxides may include, for example, zirconnates, silicates, titanates, aluminates, stannates, niobates, tantalates and rare earth oxides. Preferred additional metal oxides include $Mg_2SiO_4$, MgO, $CaTiO_3$, $MgZrSrTiO_6$, $MgTiO_3$, $MgAl_2O_4$, $WO_3$, $SnTiO_4$, $ZrTiO_4$, $CaSiO_3$, $CaSnO_3$, $CaWO_4$, $CaZrO_3$, $MgTa_2O_6$, $MgZrO_3$, $MnO_2$, PbO, $Bi_2O_3$ and $La_2O_3$. Particularly preferred additional metal oxides include $Mg_2SiO_4$, MgO, $CaTiO_3$, $MgZrSrTiO_6$, $MgTiO_3$, $MgAl_2O_4$, $MgTa_2O_6$ and $MgZrO_3$.

The additional metal oxide phases are typically present in total amounts of from about 1 to about 80 weight percent of the material, preferably from about 3 to about 65 weight percent, and more preferably from about 5 to about 60 weight percent. In one preferred embodiment, the additional metal oxides comprise from about 10 to about 50 total weight percent of the material. The individual amount of each additional metal oxide may be adjusted to provide the desired properties. Where two additional metal oxides are used, their weight ratios may vary, for example, from about 1:100 to about 100:1, typically from about 1:10 to about 10:1 or from about 1:5 to about 5:1. Although metal oxides in total amounts of from 1 to 80 weight percent are typically used, smaller additive amounts of from 0.01 to 1 weight percent may be used for some applications.

The additional metal oxide phases can include at least two Mg-containing compounds. In addition to the multiple Mg-containing compounds, the material may optionally include Mg-free compounds, for example, oxides of metals selected from Si, Ca, Zr, Ti, Al and/or rare earths.

While the present invention has been described in terms of what are at present believed to be its preferred embodiments, those skilled in the art will recognize that various modifications to the disclose embodiments can be made without departing from the scope of the invention as defined by the following claims.

What is claimed is:

1. A method of modeling electrostrictive effects and acoustic resonances in a tunable capacitor, comprising:

dividing a BST layer of said tunable capacitor into thin layers or slices with each slice's thickness representing a small fraction of an acoustic wavelength;

injecting at each junction between said slices, an acoustic current proportional to an electrical current through said tunable capacitor;

adjusting empirically characteristic impedances and complex propagation constants to account for actual process variations in manufacturing of said tunable capacitor;

adjusting empirically said characteristic impedances and complex propagation constants to account for end-effects in directions transversal to a wave direction; and wherein a real part of a vector sum of acoustic voltages at all slice junctions, divided by an electrical current vector is taken to be representative of a part of the voltage tunable capacitor's effective series resistance contributed by an electrostrictive effect and acoustic resonances.

2. The method of claim 1, wherein said electrostrictive effect is a transducer mechanism that links electrical and acoustic domains.

* * * * *